United States Patent
Jang

(10) Patent No.: US 7,489,157 B2
(45) Date of Patent: Feb. 10, 2009

(54) SYSTEM AND METHOD FOR AUTOMATICALLY MEASURING CARRIER DENSITY DISTRIBUTION BY USING CAPACITANCE-VOLTAGE CHARACTERISTICS OF A MOS TRANSISTOR DEVICE

(75) Inventor: Chang Soo Jang, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/646,462

(22) Filed: Dec. 28, 2006

(65) Prior Publication Data

US 2007/0152699 A1 Jul. 5, 2007

(30) Foreign Application Priority Data

Dec. 29, 2005 (KR) .................. 10-2005-0133540

(51) Int. Cl.
*G01R 31/26* (2006.01)
*G01R 31/28* (2006.01)

(52) U.S. Cl. .................. 324/769; 324/765; 324/158.1

(58) Field of Classification Search ......... 324/765–767, 324/158.1
See application file for complete search history.

(56) References Cited

U.S. PATENT DOCUMENTS

| | | | | |
|---|---|---|---|---|
| 4,509,012 A * | 4/1985 | Lin | .............................. | 324/767 |
| 5,442,302 A * | 8/1995 | Fujimaki | ..................... | 324/765 |
| 5,485,097 A * | 1/1996 | Wang | .......................... | 324/765 |
| 5,521,525 A * | 5/1996 | Nicollian et al. | ............. | 324/765 |
| 6,456,082 B2 * | 9/2002 | Nowak et al. | ................ | 324/458 |
| 6,492,827 B1 * | 12/2002 | Mazur et al. | ................. | 324/761 |
| 6,812,729 B2 * | 11/2004 | Chen et al. | ................... | 324/766 |
| 6,914,442 B2 * | 7/2005 | Ebara | ......................... | 324/750 |
| 2005/0073323 A1 * | 4/2005 | Kohno et al. | ................ | 324/662 |

OTHER PUBLICATIONS

"Mathematical basis for describing crucial technical shortcoming of split C-V technique in thin SOI MOSFETs" Omura, Y. IEEE Xplore electronics letters, vol. 34, Issue 15, pp. 1528-1529, Jul. 23, 1998.*
"MOS transistors characterization by split C-V method" Mileusnic, S. et al. IEEE Xplore Semiconductor conference, 2001. Cas proceedings—international, vol. 2, pp. 503-506, Oct. 9-13, 2001.*
"Comparative analysis of methods used for irradiated power MOSFET characterization" Mileusnic, S. et al. IEEE Xplore Electrotechnical conference, 2002. Melecon 2002. 11th Mediterranean, pp. 31-35, May 7-9, 2002.*

* cited by examiner

*Primary Examiner*—Ha Tran T Nguyen
*Assistant Examiner*—Karen M Kusumakar
(74) *Attorney, Agent, or Firm*—Finnegan, Henderson, Farabow, Garrett & Dunner, L.L.P.

(57) ABSTRACT

Disclosed is a system and method for automatically measuring carrier density distribution by using capacitance-voltage characteristics of a MOS transistor device. System comprises an automatic probe station for measurement of an object wafer, the automatic probe station being electrically connected to the wafer; a capacitor measuring unit having a high frequency terminal and a low frequency terminal; and a control computer for being respectively connected the automatic probe station and the capacitor measuring unit, wherein the high frequency terminal is connected to a gate of the wafer and the low frequency terminal is connected to a substrate of the wafer.

9 Claims, 2 Drawing Sheets

SYSTEM AND METHOD FOR AUTOMATICALLY MEASURING CARRIER DENSITY DISTRIBUTION BY USING CAPACITANCE-VOLTAGE CHARACTERISTICS OF A MOS TRANSISTOR DEVICE

RELATED APPLICATION

This application is based upon and claims the benefit of priority to Korean Application No. 10-2005-0133540 filed on Dec. 29, 2005, the entire contents of which are incorporated herein by reference.

BACKGROUND

1. Technical Field

The present invention relates to a system and method for automatically measuring carrier density distribution by using capacitance-voltage characteristics of a MOS transistor device.

2. Discussion of Related Art

Three methods for measuring carrier density distribution from a silicon surface of a MOS transistor device are: 1) using a physical property of a cross section of a semiconductor, 2) using chemical analysis, and 3) using spreading resistance of a cross section.

However, the conventional methods for measuring carrier density distribution suffer from numerous shortcomings that all increase the amount of time necessary to make a measurement, making these methods less than optimal.

BRIEF SUMMARY

Accordingly, consistent with the present invention there is provided a system and method for automatically measuring carrier density distribution by using capacitance-voltage characteristics of a MOS transistor device that is capable of computing impurity carrier density in accordance with the depth of a gate channel area by data corresponding to electrical characteristics according to characteristics change of an accumulation status, a depletion status, and an inversion status in addition to the analysis of thickness of gate oxide and quality of the oxide regarding a gate voltage in a characteristics measurement of conventional MOS transistor devices.

Also, consistent with the present invention there is provided a system and method for automatically measuring carrier density distribution by using capacitance-voltage characteristics of a MOS transistor device that is capable of obtaining carrier density distribution inside of a semiconductor by computing impurity carrier density of a channel area of a MOS transistor device through an arithmetic computation using a changed amount of capacitance corresponding to the gate voltage.

Consistent with the present invention there is provided a system and method for automatically measuring carrier density distribution by using capacitance-voltage characteristics of a MOS transistor device that is capable of providing an algorithm embodying an inspection through an automatic measurement among a semiconductor processes by programming an automatic DC test system.

Consistent with the present invention there is provided a system for automatically measuring carrier density distribution by using capacitance-voltage characteristics of a MOS transistor device, comprising an automatic probe station for measurement of an object wafer, the automatic probe station being electrically connected to the wafer; a capacitor measuring unit having a high frequency terminal and a low frequency terminal; and a control computer connected the automatic probe station and the capacitor measuring unit, wherein the high frequency terminal is connected to a gate of the wafer and the low frequency terminal is connected to a substrate of the wafer.

Consistent with the present invention, there is provided a method for automatically measuring carrier density distribution by using capacitance-voltage characteristics of MOS transistor device, comprising mounting a measurement object wafer in a probe station of a system for measuring carrier density distribution of a transistor device; electrically connecting the wafer to the probe station; measuring quasi-static capacitance ($C_q$) of a gate oxide of the wafer; measuring accumulation capacitance ($C_{ox}$) of the gate oxide; measuring capacitance ($C_{meas}$) from the gate while changing a gate voltage ($V_{gs}$) of the wafer; computing the thickness of a depletion layer ($W_{inv}$) and impurity carrier density (N) using the measured capacitances ($C_q$), ($C_{ox}$) and ($C_{meas}$).

It is to be understood that both the foregoing general description and the following detailed description consistent with the present invention are exemplary and explanatory and are intended to provide further explanation consistent with the invention as claimed.

BRIEF DESCRIPTION OF THE DRAWINGS

The accompanying drawings, which are included to provide a further understanding consistent with the invention and are incorporated in and constitute a part of this application, illustrate embodiment(s) consistent with the invention and together with the description serve to explain the principle consistent with the invention. In the drawings.

DETAILED DESCRIPTION

Reference will now be made in detail to the preferred embodiments consistent with the present invention, examples of which are illustrated in the accompanying drawings. Wherever possible, the same reference numbers will be used throughout the drawings to refer to the same or similar parts.

Hereinafter, a system and method for automatically measuring carrier density distribution by using capacitance-voltage characteristics of a MOS transistor device in accordance with an exemplary embodiment consistent with the present invention will be explained with reference to the accompanying drawings.

In an explanation in accordance with an exemplary embodiment consistent with the present invention, the expression "on" means that something is formed directly on another thing or indirectly formed by intervening in another layer in case of disclosing the formation "on" respective layers.

Figure 1A:
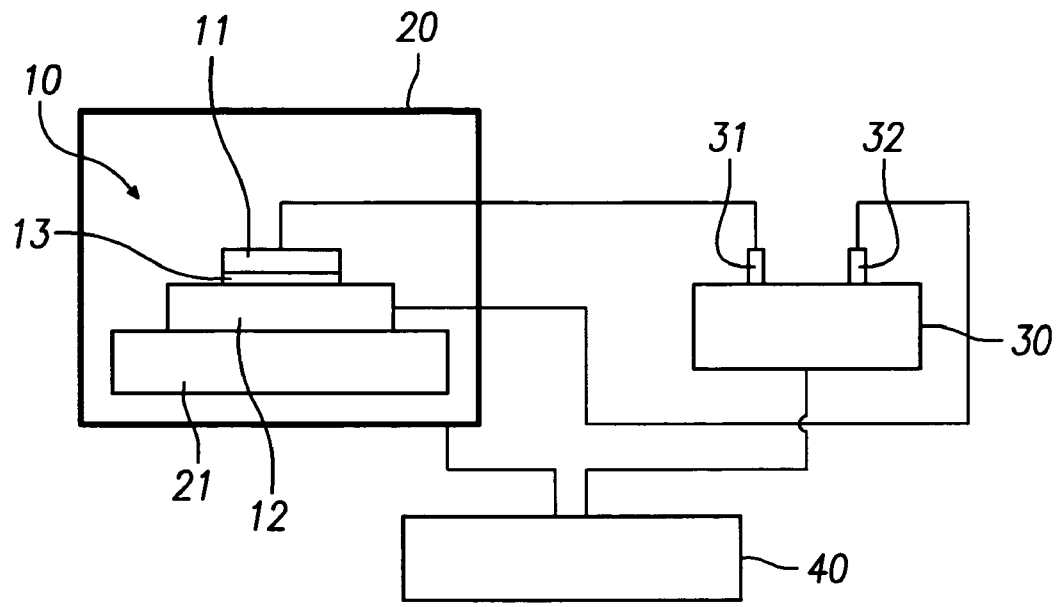
FIG. 1a is a system diagram for measuring carrier density distribution of a MOS transistor device in accordance with an exemplary embodiment consistent with the present invention.
Figure 1B:
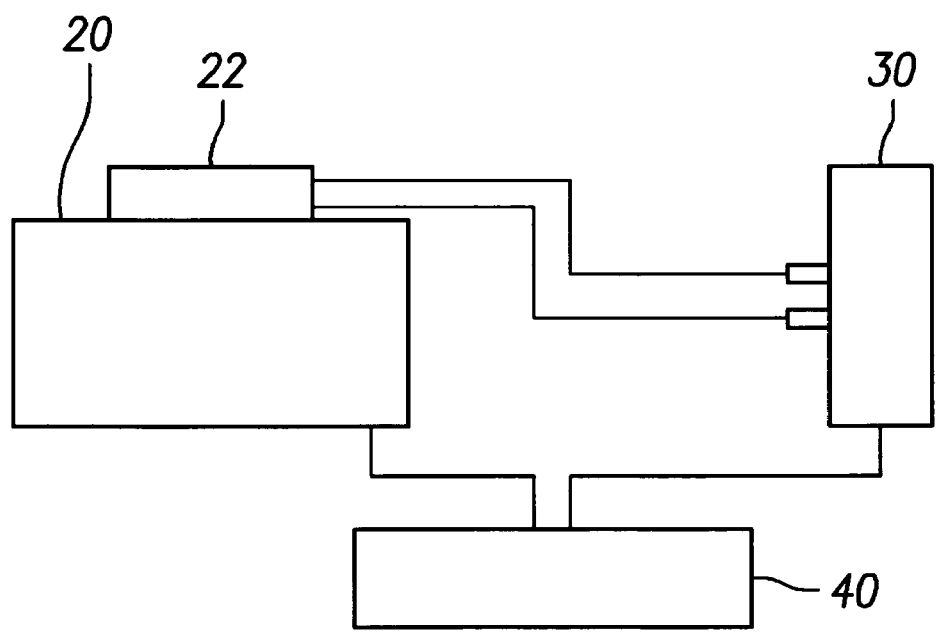
FIG. 1b is a system diagram for measuring carrier density distribution of a MOS transistor device in accordance with another exemplary embodiment consistent with the present invention.

FIGS. 1a and 1b respectively represent a system diagram for measuring carrier density distribution of a MOS transistor device in accordance with an embodiment consistent with the present invention.

FIG. 1a is an example of a system for measuring carrier density distribution of a MOS transistor device using an Automatic Test System in a Manual Test System. In the case of measurement and analysis, except for mechanical operations such as loading a wafer at a Probe Station in the Manual Test System, the present invention can be applied and thus the procedure can be automated.

In addition, FIG. 1b is an example of a system for measuring carrier density distribution of a MOS transistor device using an Automatic Test System in an automatic DC Parametric Test System.

Referring to FIGS. 1a and 1b, a measurement object wafer 10 is positioned on a chuck 21 inside of a probe station 20. A high frequency terminal 31 of a capacitance measuring unit 30 (specifically, a LCR meter) is connected to a gate 11 of wafer 10, and a low frequency terminal 32 is connected to a substrate 12 of wafer 10. Probe station 20 and capacitance measuring unit 30 are connected to a control computer 40.

Probe station 20 of FIG. 1a is connected to a measuring device (not shown) using a probe; and probe station 20 of FIG. 1b uses a probe card 22.

Probe station 20 is shielded from external influences using a dark box or a shielding box in order to prevent distortion of data measured by an external light or by electromagnetic waves.

The following is a description of a method for automatically measuring carrier density distribution by using capacitance-voltage characteristics of a MOS transistor device.

Wafer 10 is mounted inside of probe station 20, and an electrical connection by the probe or the probe card is performed.

A low frequency is adjusted as the reference frequency of capacitance measuring unit 30. A gate channel is adjusted as an inversion status by supplying DC voltage at gate 11 of a MOS transistor device and the quasi-static capacitance ($C_q$) of a gate oxide 13 is measured.

A high frequency is then adjusted as the reference frequency of capacitance measuring unit 30. A gate channel is adjusted as an accumulation status by supplying DC voltage at gate 11 of a MOS transistor device and quasi-static capacitance ($C_{ox}$) of a gate oxide 13 is measured.

An accumulation capacitance ($C_{ox}$) and thickness ($T_{ox}$) of gate oxide 13 are obtained by Equations 1 and 2 regarding the area of gate oxide 13.

$$C_{ox} = \frac{\varepsilon_{ox} \varepsilon_o A}{T_{ox}} \quad \text{[Equation 1]}$$

$$T_{ox} = \frac{\varepsilon_{ox} \varepsilon_o A}{C_{ox}}, \quad \text{[Equation 2]}$$

In Equations 1 and 2, $\varepsilon_o$ denotes the dielectric constant in a vacuum state, and $\varepsilon_{ox}$ denotes the dielectric constant of the gate oxide.

A measured capacitance ($C_{meas}$) corresponding to respective gate voltages ($V_{gs}$) is measured at gate 11 while changing high frequency voltage of capacitance measuring unit 30 in order to enable the gate channel of the MOS transistor device to be an inversion status through a depletion status from an accumulation status.

Impurity carrier density corresponding to the depth from silicon surface of the channel of the MOS transistor device is computed as follows using the measured data.

The relation of a gate oxide in accordance with the gate voltage and the depth of a depletion layer is shown in Equations 3 through 6 below.

$$\frac{1}{C_{meas}} = \frac{1}{C_{ox}} + \frac{1}{C_{siinv}} \quad \text{[Equation 3]}$$

$$\frac{1}{C_{siinv}} = \frac{1}{C_{meas}} - \frac{1}{C_{ox}} \quad \text{[Equation 4]}$$

$$W_{inv} = \frac{\varepsilon_{si} \varepsilon_o A}{C_{siinv}} \quad \text{[Equation 5]}$$

$$W_{inv} = A \varepsilon_{si} \varepsilon_0 \left( \frac{1}{C_{meas}} - \frac{1}{C_{ox}} \right) \quad \text{[Equation 6]}$$

In Equations 3 through 6, $C_{meas}$ denotes a capacitance measured at a gate terminal regarding the respective gate voltages, $C_{siinv}$ and $W_{inv}$ respectively denote capacitance and thickness of a depletion layer washed off the silicon surface by a gate voltage, and $\varepsilon_{si}$ denotes relative dielectric constant of silicon.

In addition, by using the measured quasi-static capacitance ($C_q$) of gate oxide 13, accumulation capacitance ($C_{ox}$), capacitance ($C_{meas}$) measured according to respective gate voltages ($V_{gs}$), the impurity carrier density (N) in substrate of a MOS transistor device can be computed by Equation 7.

$$N = \frac{-2(1 - C_q/C_{ox})/(1 - C_{meas}/C_{ox})}{A^2 q \varepsilon_{si} \varepsilon_0} \left[ \frac{\partial}{\partial V_{gs}} \left( \frac{1}{C_{meas}^2} \right) \right]^{-1} \quad \text{[Equation 7]}$$

In Equation 7, q denotes the quantity of electric charge ($1.60219 \times 10^{-19}$C) of an electron.

Through the above-mentioned method, the depth ($W_{inv}$, Equation 6) of a depletion layer and the impurity carrier density (N, Equation 7) of a substrate may be computed.

Figure 2:
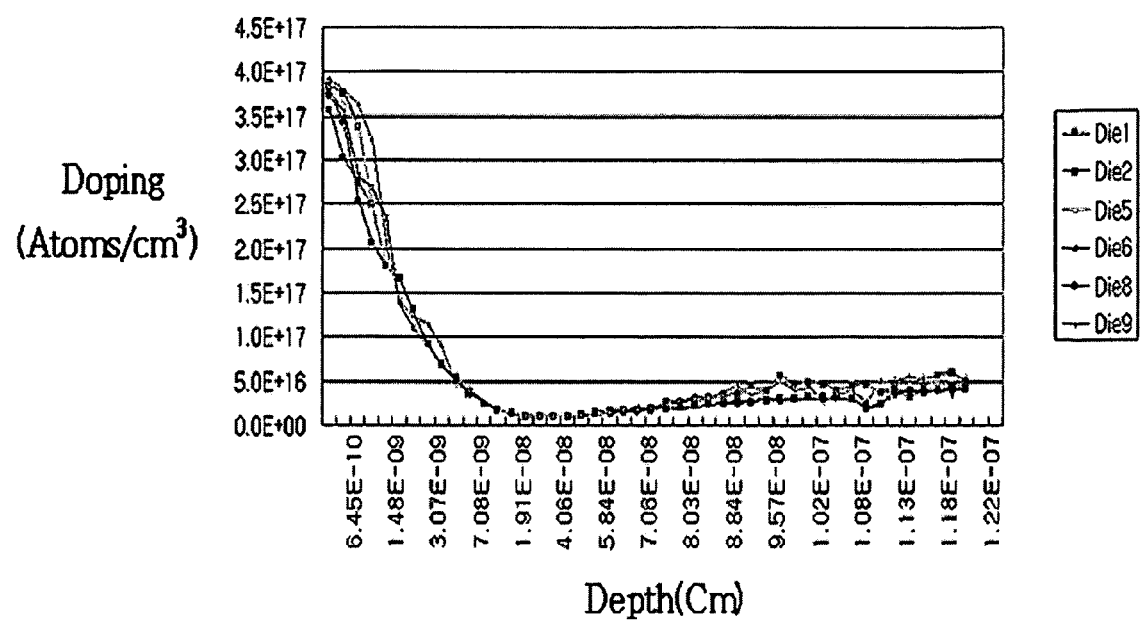
FIG. 2 is a graph showing carrier density distribution of a MOS transistor device through a measuring system.

FIG. 2 is a graph showing carrier density distribution of a MOS transistor device measured and analyzed through a measuring system and method. As shown in FIG. 2, by measuring data corresponding to electrical characteristics according to characteristic change of an accumulation status, a depletion status, and an inversion status, impurity carrier density in accordance with the depth of a gate channel area may be obtained.

As described above, according to a system and method for automatically measuring carrier density distribution by using capacitance-voltage characteristics of a MOS transistor device, carrier density of a channel area of a MOS transistor device may be easily analyzed through only an electrical measurement by using measuring change of capacitance corresponding to the gate voltage as an important characteristics of a MOS transistor device.

Thus, according to a system and method for automatically measuring carrier density distribution by using capacitance-voltage characteristics of a MOS transistor device, because carrier density distribution of a channel area can be analyzed through not physical property or chemical analysis but an electrical nondestructive inspection in case of embodying measurement pattern of MOS structure having a proper area, loss of wafer specimen, which is the measurement object, may be prevented.

In addition, according to a system and method for automatically measuring carrier density distribution by using capacitance-voltage characteristics of a MOS transistor device, because analysis can be performed in DC parametric measurement test implemented in a production step of semiconductor products if a program using control test unit of DC parametric system is applied, malfunction of wafer at an early semiconductor process may be detected.

It will be apparent to those skilled in the art that various modifications may be made without departing from the spirit and scope consistent with the invention as defined by the appended claims.

What is claimed is:

1. A system for automatically measuring carrier density distribution by using capacitance-voltage characteristics of a MOS transistor device, comprising:

an automatic probe station for measurement of an object wafer, the automatic probe station being electrically connected to the wafer;

a capacitor measuring unit separately having a high frequency terminal and a low frequency terminal; and a control computer connected to both the automatic probe station and the capacitor measuring unit, wherein the control computer is directly connected to the automatic probe station, and wherein the high frequency terminal is connected to a gate of the wafer and the low frequency terminal is connected to a substrate of the wafer.

2. The system according to claim 1, wherein the automatic probe station includes a probe card electrically connected to a measurement device of the wafer.

3. The system according to claim 1, wherein the capacitor measuring unit is a DC parametric test system.

4. The system according to claim 1, wherein the probe station is installed in a dark box in order to prevent distortion of measurement data due to an external light or an electromagnetic wave.

5. A method for automatically measuring carrier density distribution by using capacitance-voltage characteristics of a MOS transistor device, comprising:

mounting a measurement object wafer in a probe station of a system for measuring carrier density distribution of transistor device;

electrically connecting the wafer to the probe station;

measuring the quasi-static capacitance ($C_q$) of a gate oxide of the wafer with a capacitor measuring unit separately having a high frequency terminal and a low frequency terminal, wherein the high frequency terminal is connected to a gate of the wafer and the low frequency terminal is connected to a substrate of the wafer;

measuring the accumulation capacitance ($C_{ox}$) of the gate oxide with the capacitor measuring unit;

measuring the capacitance ($C_{meas}$) from the gate while changing a gate voltage ($V_{gs}$) of the wafer; and computing the thickness of a depletion layer ($W_{inv}$) and impurity carrier density (N) using the measured capacitances ($C_q$), ($C_{ox}$) and ($C_{meas}$), wherein a control computer is connected to both the automatic probe station and the capacitor measuring unit, and wherein the control computer is directly connected to the automatic probe station.

6. The method according to claim 5, wherein measuring the quasi-static capacitance $C_q$ of a gate oxide of the wafer is performed by adjusting a reference frequency of the capacitance measuring unit as a low frequency and enabling a gate channel to be in an inversion state.

7. The method according to claim 5, wherein measuring the accumulation capacitance ($C_{ox}$) of the gate oxide is performed by adjusting a reference frequency of the capacitance measuring unit as a high frequency and enabling a gate channel to be in an accumulation state.

8. The method according to claim 5, wherein measuring the capacitance ($C_{meas}$) from the gate while changing a gate voltage ($V_{gs}$) of the wafer is performed by changing a high frequency voltage of the capacitance measuring unit in order to enable the gate channel to be in an inversion state through a depletion state from an accumulation state.

9. The method according to claim 5, wherein the depletion layer $W_{inv}$ and the impurity carrier density (N) are computed by the following equation, $$W_{inv} = A\varepsilon_{si}\varepsilon_0 \left( \frac{1}{C_{meas}} - \frac{1}{C_{ox}} \right)$$

$$N = \frac{-2(1 - C_q/C_{ox})/(1 - C_{meas}/C_{ox})}{A^2 q \varepsilon_{si} \varepsilon_0} \left[ \frac{partial}{partial V_{gs}} \left( \frac{1}{C_{meas}^2} \right) \right]^{-1},$$

wherein, $C_{meas}$ denotes capacitance measured at a gate terminal regarding respective gate voltages, $C_{ox}$ and $W_{inv}$ respectively denote accumulation capacitance of the gate oxide and thickness of a depletion layer washed off silicon surface by gate voltage, $\varepsilon_{si}$ denotes relative dielectric constant of silicon, and q denotes the quantity of electric charge ($1.60219 \times 10^{-19}$ C) of an electron.

* * * * *